United States Patent
Saffier-Ewing

(10) Patent No.: US 10,498,228 B1
(45) Date of Patent: Dec. 3, 2019

(54) SUB-CIRCUIT WITH CYCLICALLY SWAPPED STANDBY CIRCUITS

(75) Inventor: Gabriel Saffier-Ewing, Santa Cruz, CA (US)

(73) Assignee: ANADYNE, INC., Santa Cruz, CA (US)

( * ) Notice: Subject to any disclaimer, the term of this patent is extended or adjusted under 35 U.S.C. 154(b) by 655 days.

(21) Appl. No.: 13/373,662

(22) Filed: Nov. 23, 2011

Related U.S. Application Data

(60) Provisional application No. 61/459,885, filed on Dec. 20, 2010.

(51) Int. Cl.
| | | |
|---|---|---|
| *H02M 3/06* | (2006.01) | |
| *H02M 3/08* | (2006.01) | |
| *H03M 1/12* | (2006.01) | |
| *G01R 15/14* | (2006.01) | |

(52) U.S. Cl.
CPC .............. *H02M 3/06* (2013.01); *H02M 3/08* (2013.01); *H03M 1/12* (2013.01); *G01R 15/14* (2013.01)

(58) Field of Classification Search
CPC . H02M 3/07; H02M 3/18; H03K 3/18; H03K 3/53; H03K 3/537; G01R 15/14; H03M 1/38; H03M 1/66; H03M 1/12
USPC .......... 307/109, 108, 116, 125, 39; 341/172, 341/166, 144, 143, 162, 161, 145
See application file for complete search history.

(56) References Cited

U.S. PATENT DOCUMENTS

| | | | | |
|---|---|---|---|---|
| 6,456,223 B1* | 9/2002 | Yu | ............................ | H03M 1/08 341/161 |
| 6,794,771 B2* | 9/2004 | Orloff | ...................... | F23N 5/123 307/117 |
| 6,963,300 B1* | 11/2005 | Lee | ...................... | H03M 1/1245 341/162 |
| 7,265,705 B1* | 9/2007 | Lee | ........................ | H03M 1/145 341/160 |
| 7,319,425 B2* | 1/2008 | Fiorenza | ................. | H03F 3/005 341/166 |
| 7,852,254 B1* | 12/2010 | Ginetti | ................... | H03M 1/442 341/161 |
| 2003/0234582 A1* | 12/2003 | Orloff | ...................... | F23N 5/123 307/117 |
| 2007/0069939 A1* | 3/2007 | Felder | ...................... | H03M 3/35 341/172 |
| 2007/0216563 A1* | 9/2007 | Wu et al. | ........................ | 341/155 |
| 2010/0194469 A1* | 8/2010 | Amrutur et al. | ............... | 327/538 |
| 2010/0321220 A1* | 12/2010 | Ginetti | ........................ | 341/143 |

(Continued)

*Primary Examiner* — Fritz M Fleming
*Assistant Examiner* — Jagdeep S Dhillon
(74) *Attorney, Agent, or Firm* — Jeffrey A. Hall

(57) ABSTRACT

A circuit that can rapidly and precisely change the state of any circuit with some form of memory, whether it is a voltage across a capacitor, a current in an inductor, a digital value, or otherwise, using cyclically swapped circuits. For the case of a value stored on a capacitor: By swapping extra capacitors with preemptively set voltages using electronic switches, inherent settling times and defects of real RC circuits can be replaced with electronic switching times and switch defects. This dramatically improves speed and performance and is applicable on many circuit types including faster acquisition sample and hold circuits, faster amplifier nulling circuits, and any circuit that requires rapidly changing the DC voltage stored on a capacitor, and any circuit that requires rapidly changing the state or a circuit that has memory.

13 Claims, 9 Drawing Sheets

(56) References Cited

U.S. PATENT DOCUMENTS

| | | | |
|---|---|---|---|
| 2011/0006935 A1* | 1/2011 | Kawahito | H03M 1/0602 341/126 |
| 2011/0074487 A1* | 3/2011 | Behnia | G02F 1/0121 327/355 |
| 2012/0146825 A1* | 6/2012 | Guedon | H03M 1/0665 341/145 |

* cited by examiner

SUB-CIRCUIT WITH CYCLICALLY SWAPPED STANDBY CIRCUITS

CROSS REFERENCE TO RELATED APPLICATIONS

This application is related to and claims priority from U.S. Provisional Patent Application 61/459,885, filed Dec. 20, 2010.

BACKGROUND OF THE INVENTION

Technical Field

This invention relates to electronic circuits and sub-circuits which utilize capacitors, and in particular, to a sub-circuit which uses cyclically swapped capacitors to effectively force the voltage stored on a capacitor to an arbitrary voltage with great speed and precision.

Background Art

A capacitor is a passive electrical component used to store energy in an electric field, typically comprising a pair of conductors separated by an insulator or dielectric. When there is a potential difference or voltage, across the conductors, a static electric field develops across the dialectic, causing positive charge to collect on one plate and negative charge on the other plate. Energy is stored in the electrostatic field. An ideal capacitor is characterized by a single constant value, capacitance, measured in farads. This is the ratio of the electric charge on each conductor to the potential difference between them. Capacitors are widely used in different electronic circuits for blocking direct current (DC) while allowing alternating current (AC) to pass. Capacitors are used in filter networks, for smoothing the output of power supplies, in resonant circuits that tune radios to particular frequencies, radar systems, system control devices, and many other applications.

Many circuits use capacitors to store a voltage or to remove unwanted frequency components of a spectrally complex signal. There are several limitations on how quickly the DC voltage across a capacitor can be changed with high speed and precision. First, the non-ideal behavior of capacitors causes them to settle to high precision slowly, even if the highest quality commercially available components are used. Second, the non zero output impedance of whatever circuitry is used to assert a new voltage across the capacitor limits how low the resistor-capacitor or RC time constant can be reduced to with switches. This problem is compounded by the fact that many op amps that would be used to assert a voltage on a capacitor are unstable driving capacitive loads settle slowly, and have non-zero output impedance, particularly at high frequency. Further, when a capacitor is used to lower the high frequency gain of a feedback loop, as seen in FIG. 5a, lowering the resistance of the RC network can induce oscillations.

The settling time of real capacitors is even longer than the theoretical settling time. For an ideal 1 uF capacitor it takes hundreds of microseconds for the voltage to settle to 0.01% using a 50 ohm discharge resistance to a solid ground plane. For a real RC network using high quality polypropylene dielectric capacitors the theoretical settling time is extended to the order of tens of milliseconds. Many applications, especially those involving large dynamic range, benefit from decreasing this settling time.

In the circuit shown in FIG. 2a, if the AC coupling filter is placed on the input of a very high gain amplifier, the defects of a typical RC discharge become very apparent. The capacitor settling problems have a severe negative impact on the performance of the input filters for logarithmic amplifiers because their gain is very large for small inputs.

For applications where the input is unipolar, i.e., always positive or always negative, the averaging tendencies of pure AC coupling circuits is very problematic. For power measurements, for example, negative values are physically meaningless. Often a varying signal that is superposed on top of a constant background signal is interesting, however, so a circuit that subtracts the DC value and reveals the time varying signal with the most clarity is desirable. AC coupling circuits do serve to remove such a DC input, but their outputs tend to drift to the average of the input as seen in FIG. 2c, allowing negative outputs readily.

Specifically useful for power measurement of pulsed signals, once a signal's duration has exceeded a predefined limit, it should be stripped so that the time varying signals superposed on it can be measured accurately. This stripping action typically involves precisely changing the voltage of a capacitor rapidly.

Many circuits have some form of memory; they can be in many different states, and the state they are in at any given time depends on the inputs the have previously received over some amount of time. This state can be, but is not limited to, the voltage stored on a capacitor, the current in an inductor, or a digital value. It is often desirable and also difficult to change the state of such a circuit quickly with great precision. Several circuits are disclosed herein, where the memory is an analog voltage stored on a capacitor.

Further, analog switches have inherent defects themselves. These defects are often analyzed as a charge injection, the amount of charge that is deposited at the switching nodes in a switching event. Modern analog electronic switches with charge injection of less than 1 pico coulomb applied to a 1 uF capacitor results in a voltage defect on the capacitor of less than 1 uV. The analog Devices ADG1634, made by Analog Devices Corporation, for example, has an on resistance of 4.5 ohms, switching times of less than 200 ns, and charge injection of 12 pico coulombs.

The present invention provides, for the first time, a circuit that can very rapidly and precisely change the DC voltage across a capacitor using cyclically swapped standby capacitors. Since the standby capacitor has already settled to the desired voltage before swapping, the capacitor settling time is replaced by the switch's transition time. Accordingly, settling times of hundreds of microsecond can be reduced to hundreds of nano seconds which is highly desirable in a wide variety of applications.

The present invention also provides a method of constructing an improved circuit using swapped capacitors, for enhancing speed and precision of operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

SUMMARY OF THE INVENTION

A sub-circuit or circuit is disclosed comprising two or more capacitors, with at least one active capacitor, which is active in an application circuit and at least one standby capacitor which is held on standby. One or more electronic switches are operably linked to one or more of the standby capacitors. The electronic switches allow the controlled interchange of one or both plates of the standby capacitors and/or the active capacitors when an electronic signal is activated, so as to effectively make what was previously an active capacitor a standby capacitor and what was previously a standby capacitor an active capacitor. One or more bits of memory or its equivalent are used to determine at any given moment which capacitor is an active capacitor and which is a standby capacitor. A circuit is operably linked to the sub-circuit to provide a desired DC voltage across any of said standby capacitors.

The sub-circuit may be applied to many circuit types, including AC coupling applications circuits, pseudo-AC coupling restoration circuits, sample and hold circuits, and many other types to improve efficiency and precision.

A method for improving performance of any circuit that changes the voltage across a capacitor with speed and precision.

Further, a sub-circuit or circuit is disclosed comprising two or more copies of a circuit that has some form of memory, at least one active copy, which is active in an application circuit and at least one standby copy which is held in a desired state. One or more electronic switches are operably linked to one or more of the standby copies. The electronic switches allow the controlled replacement of the active copy with the standby copy in the application circuit when an electronic signal is activated, so as to effectively make what was previously an active copy a standby copy and what was previously a standby copy an active copy. A circuit is operably linked to the sub-circuit to hold the standby copies memory in a desired state.

Cyclically swapped capacitors are one general embodiment of this invention.

BRIEF DESCRIPTION OF DRAWINGS

The accompanying drawings, which are incorporated in and constitute a part of the specification, illustrate a preferred embodiment of the invention and, together with a general description given above and the detailed description of the preferred embodiment given below, serve to explain the principles of the invention.

FIG. 2b shows a sample input voltage signal for the circuit of FIG. 2a.

FIG. 2c shows a sample output voltage signal for the circuit of FIG. 2a.

FIG. 3b shows the input signal presented to the circuit of 3a.

FIG. 3c shows the reset signal presented for the circuit of FIG. 3a

FIG. 4b shows a sample input voltage for the circuit of FIG. 4a.

FIG. 4c shows a sample output voltage signal for the circuit of FIG. 4a.

FIG. 5a shows a resettable version of the circuit of FIG. 4a.

FIG. 5b shows an input signal presented to the circuit of FIG. 5a.

FIG. 5c shows a reset signal presented to the circuit of FIG. 5a.

FIG. 7b shows sample input signals presented to the circuit of FIG. 7a.

FIG. 7c shows sample reset signals present to the circuit of FIG. 7a.

DETAILED DESCRIPTION OF THE PREFERRED EMBODIMENTS

Figure 1A:
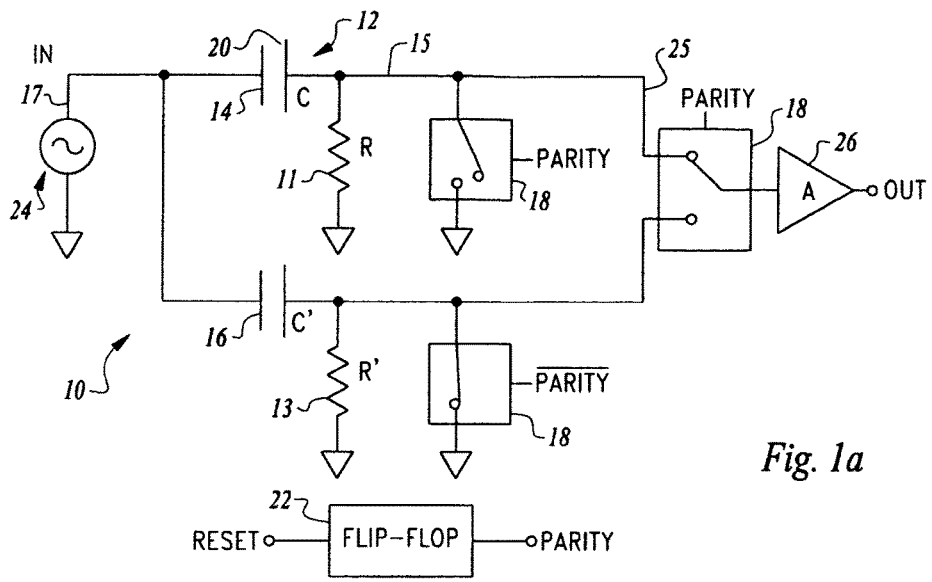
FIG. 1a shows a preferred embodiment of the invention applied to an AC coupling circuit, according to the invention.

Reference will now be made in detail to the present preferred embodiments of the invention as illustrated in the accompanying drawings.

The preferred embodiments of the present invention, described herein and illustrated in the drawings, in particular FIGS. 1a, 6a, 8a, and 9, provide a circuit that can very rapidly and precisely change the DC voltage across a capacitor using cyclically swapped standby capacitors. Because the standby capacitor has already settled to the desired voltage before swapping, the capacitor settling time is replaced by the switch's transition time. Increased efficiencies result where settling times of hundreds of microseconds can be reduced with the present invention to hundreds of nano second using this circuit and methodology.

The preferred embodiment of the invention further comprises a sub-circuit or circuit with two or more copies of a circuit that has some form of memory, at least one active copy, which is active in an application circuit and at least one standby copy which is held in a desired state. One or more electronic switches are operably linked to one or more of the standby copies. The electronic switches allow the controlled replacement of the active copy with the standby copy in the application circuit when an electronic signal is activated, so as to effectively make what was previously an active copy a standby copy and what was previously a standby copy an active copy. A circuit is operably linked to the sub-circuit to hold the standby copies memory in a desired state. Cyclically swapped capacitors are one general embodiment of this invention.

In FIG. 1a, a circuit or sub-circuit 10, comprises, in a preferred embodiment, input signal 17, includes resistors 11 and 13, amplifier 26, two or more capacitors 12, comprising at least one active capacitor 14, which is active in an application circuit 15, and at least one standby capacitor 16, which is held on standby. One or more electronic switches 18, are operably linked to one or more of the standby capacitors 16. The electronic switches 18, allow the controlled interchange of one plate 20, or both plates of standby capacitors 16, and/or said active capacitors 14, when an electronic signal is activated, so as to effectively make what was previously an active capacitor a standby capacitor and what was previously a standby capacitor an active capacitor. One or more bits of memory 22, or its equivalent, are preferably used to determine at any given moment which capacitor 12 is an active capacitor 14, and which is a standby capacitor 16. A circuit 24, operably linked to said sub-circuit 10, to provide a desired DC voltage across any of the standby capacitors 16. An AC coupling filter 25, may be used so that when a reset signal is applied as a trigger signal in the electronic switches 18, the output of the circuit is nulled.

Immediately after a swap event in electronic switches 18, circuit 24, takes some settling time to prepare what now has become a standby capacitor 16. If a particular application benefits from being able to swap pre-charged capacitors into the circuit before this settling time is completed, several standby capacitors 16, can be implemented, enough so that there is always a pre-charged and settled capacitor ready to be swapped into the circuit application whenever needed.

In simple applications with only two capacitors being switched back and forth, the memory 22, portion of the circuit can be a simple flip flop, as seen in FIG. 1a. Preferably, the flip flop output is connected to the electronic switches 18, so that when the flip flop is high one capacitor 12, is an active capacitor 14, and when the flip flop is low, the other capacitor 16, is now active. The present sub-circuit, circuits, and methods, apply as well to extensions of this concept to a cycle of capacitors greater than two, with the appropriate logic and memory to cycle in the desired order through the standby capacitors 16. Such a circuit, for example, would use a multiplexer and enough bits of data memory 22, to identify a unique set of active capacitors 14, at any given time.

Figure 2A:
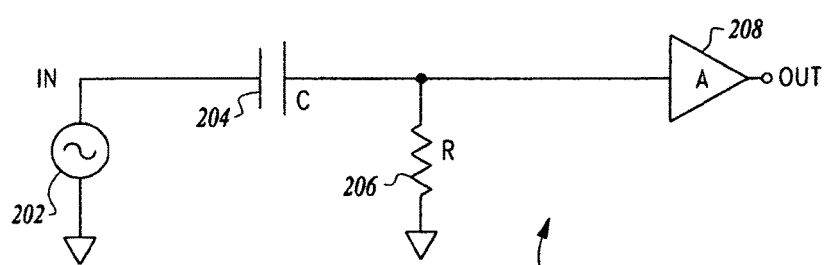
FIG. 2a shows a simple AC coupling circuit, illustrating a configuration of prior art.
Figure 2B:
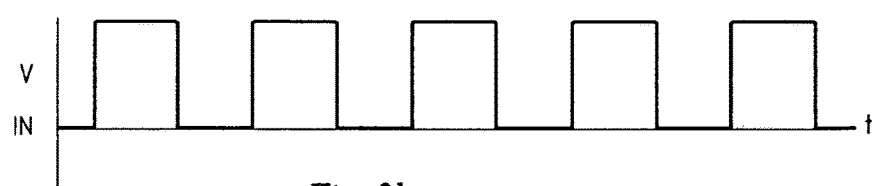

With reference now to FIG. 2a, a simple prior AC coupling circuit 200, is shown to illustrate the improvements and novelty of the present invention. In FIG. 2a, circuit 200 has input signal 202, a couple capacitor 204, a discharge resistor 206, and an amplifier 208 to buffer the output. This type of prior AC coupling circuit nulls DC offsets at the input after a time determined by the RC constant. In FIG. 2b a sample input of FIG. 2a is illustrated, and in 2c the corresponding output. It is often desirable to null the output of such a circuit at an arbitrary point in time.

In FIG. 2b, a sample input voltage is shown. The x axis "t" represents time and the y axis "v" represents voltage.

Figure 1B:
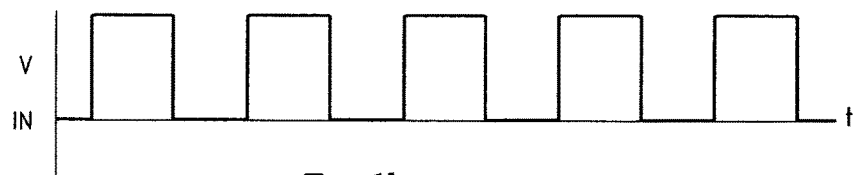
FIG. 1b shows the input signals presented to the circuit in FIG. 1a, according to the invention.
Figure 2C:
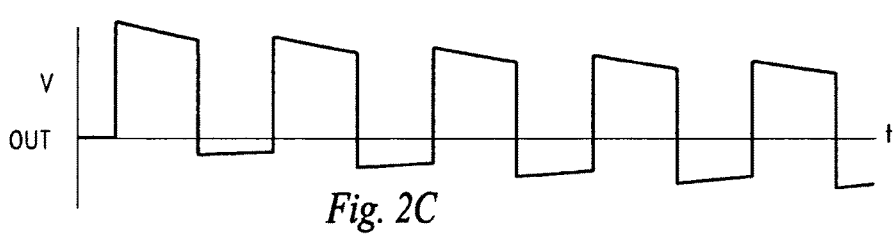

In FIG. 2c the output of the circuit in FIG. 2a is shown with the input of FIG. 1b. As is seen, the AC coupling circuits output drifts to the average of the input. In FIG. 2c the x axis "t" represents time and the y axis "v" represents voltage.

Figure 1C:
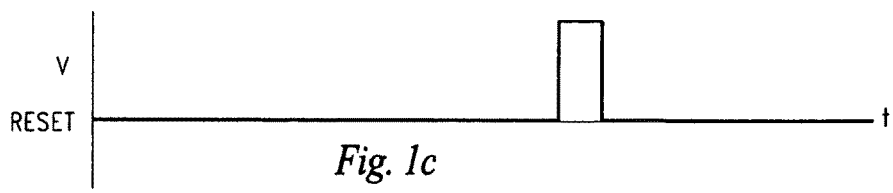
FIG. 1c shows the reset signals presented to the circuit of FIG. 1a, according to the invention.
Figure 1D:
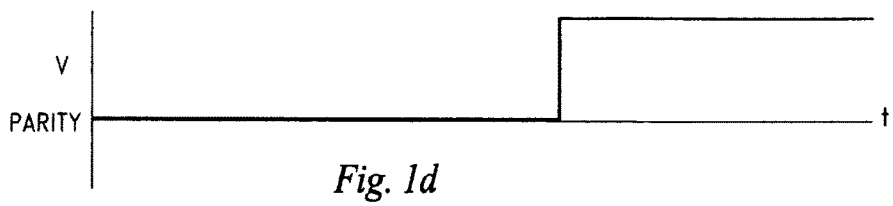
FIG. 1d shows the other parity signal presented to the circuit of FIG. 1a, according to the invention.
Figure 3A:
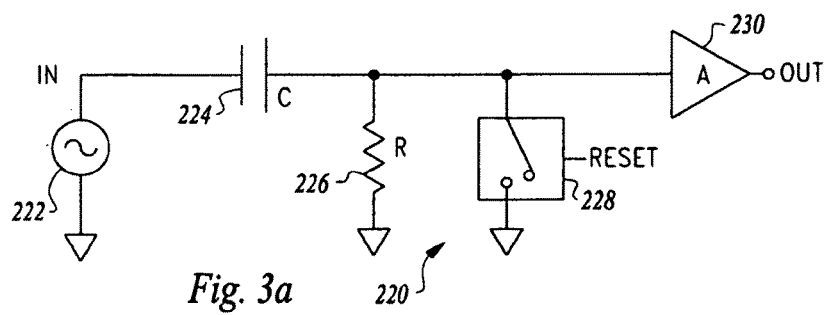
FIG. 3a shows a prior AC coupling circuit similar to FIG. 2a but including a reset switch.

A nulling function can be implemented using a single switch and single capacitor, as shown in FIG. 3a, which is the AC coupling circuit shown in FIG. 2a, but now including a reset switch 228. In FIG. 3a, input signal 222, is shown going into the circuit with capacitor 224, discharge resistor 226, and amplifier 230 to buffer the output. A problem with such prior circuit is that there is a time period where the output is erroneous while the capacitor is settling. This is illustrated in FIG. 3d. In FIGS. 1b, 1c, and 1d, in contrast, show the improved circuit characteristics of the preferred embodiment of the present sub-circuit of the invention illustrated in FIG. 1a. and the resulting output. As seen, and discussed in more detail below, the swapped capacitors of FIG. 1a replace the settling time with the switching time, giving vastly improved performance.

In FIG. 3a the AC coupling circuit is similar to the circuit of 2a, with a reset switch 228. In this prior circuit, when the reset signal is pulled high, the electronic switch closes, effectively forcing the voltage on the input capacitor 224, to zero, nulling the output.

Figure 3B:
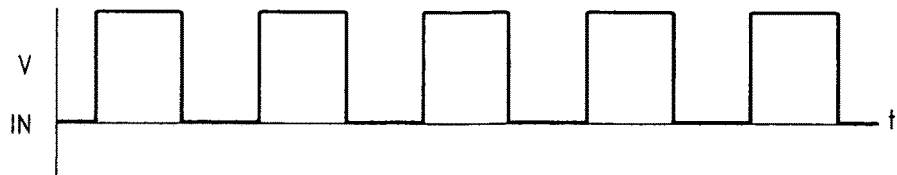

Referring now to FIG. 3b, the input signal present of the circuit of FIG. 3a is illustrated. The x axis "t" represents time, and the y axis "v" represents voltage.

Figure 3C:
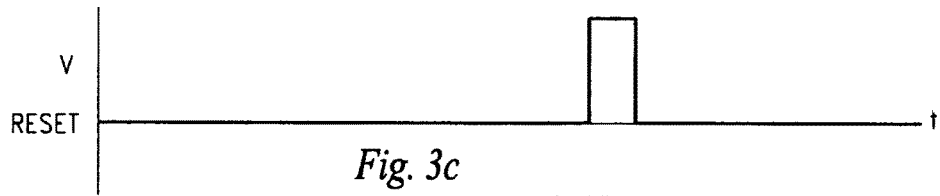
Figure 3D:
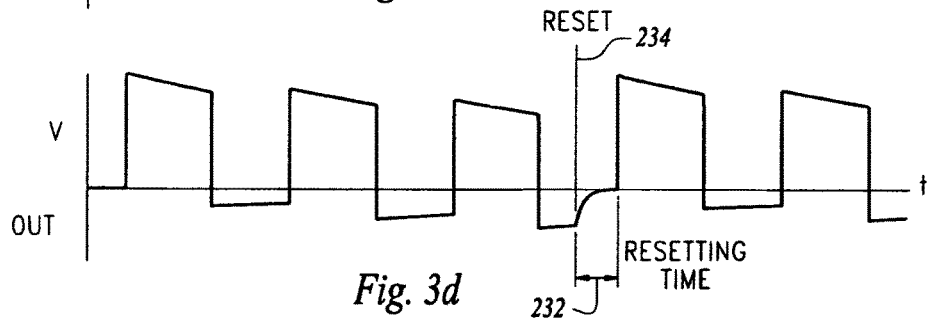
FIG. 3d shows the output of the circuit of FIG. 3a with the input signals from FIG. 3b.

In FIG. 3c the reset signal of the circuit of FIG. 3a is illustrated. The x axis "t" represents time, and the y axis "v" represents voltage.

With reference now to FIG. 3d, the output of the circuit of FIG. 3a with the input signal from FIG. 3b are shown. The x axis "t" represents time, and the y axis "v" represents voltage. The moment in time along the x axis when the reset signal is pulled high 234, is called out for clarity. The settling time 232, of the capacitor 226, is shown explicitly to clarify the time when the circuits output is erroneous.

Figure 4A:
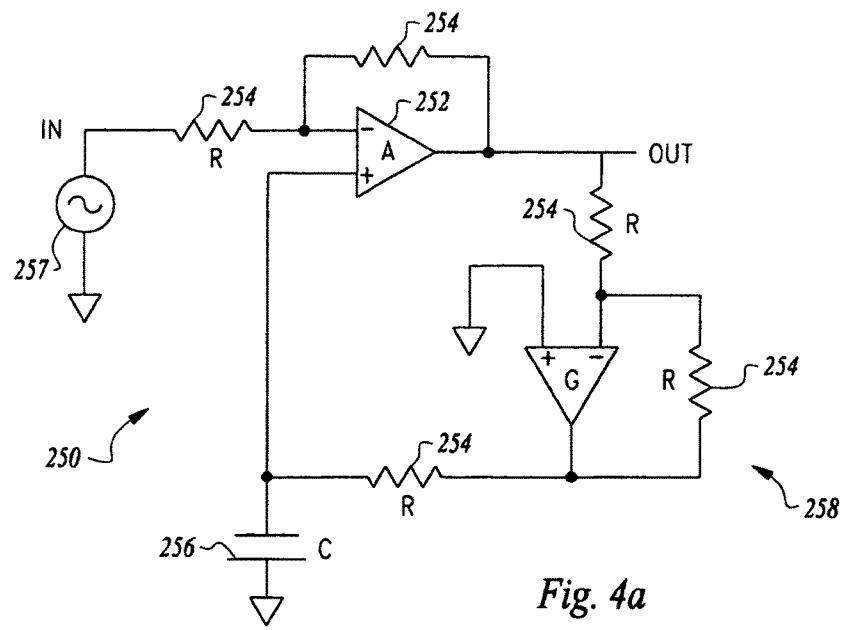
FIG. 4a shows a typical prior AC coupling circuit.

Before describing the preferred embodiments of the invention in more detail it is illustrative to consider configurations of other prior sub-circuits and circuits. In FIG. 4a, a typical pseudo AC coupling circuit 250, is shown with input signal 251, and amplifier 252, a plurality of resistors 254, and capacitor 256. In this type of circuit, the output of amplifier 252, is fed back into it input with a RC filter 258, to null the output. The RC filter serves several purposes, it lowers the high frequency gain of the feed back loop, ensuring stability, and it allows a higher frequency signal to pass through unchanged allowing accurate measurement. This type of circuit behaves very much like the AC coupling circuit shown in FIG. 2a, but values used in the RC circuit can be manipulated with the gain in the feedback loop.

Figure 4B:
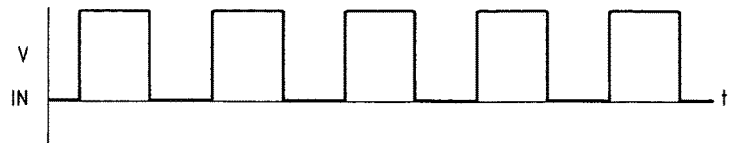
Figure 4C:
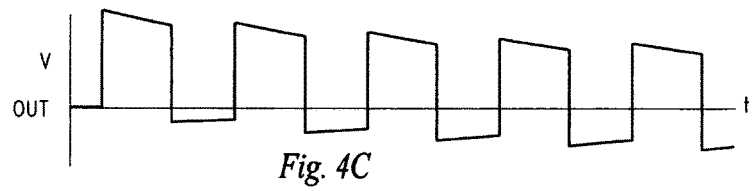
Figure 5A:
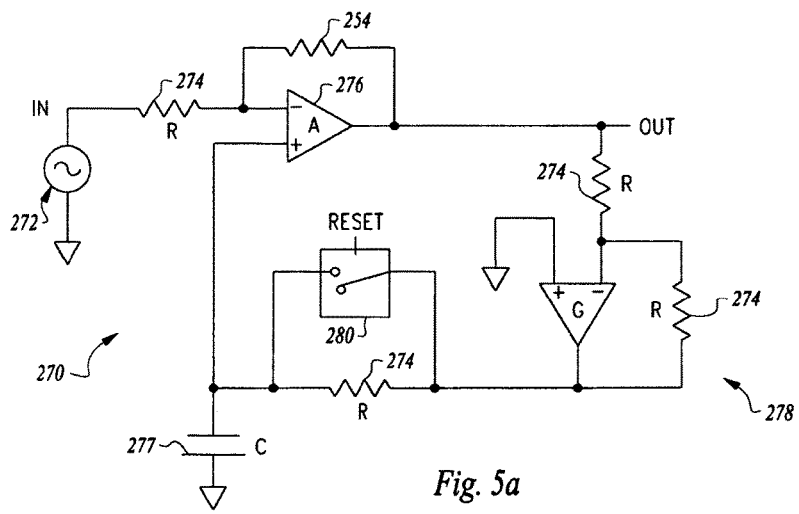

The pseudo-AC circuit 250, shown in FIG. 4a, has a sample input illustrated in FIGS. 4b, and 4c, shows the corresponding output. It is often desirable to null the output of such a circuit at an arbitrary point in time. A nulling function can be implemented using a single switch and single capacitor as shown in FIG. 5a. However, there is a time period where the output is erroneous at reset 234, settling time 232, while the capacitor is settling, shown in FIG. 5d. FIGS. 6a, 6b, 6c, 6d, and 6e, show the improved circuit of the present invention using the sub-circuit disclosed herein and the resulting output. The swapped capacitors used the present invention, replace the settling time with the switching time, giving vastly improved performance.

Figure 7A:
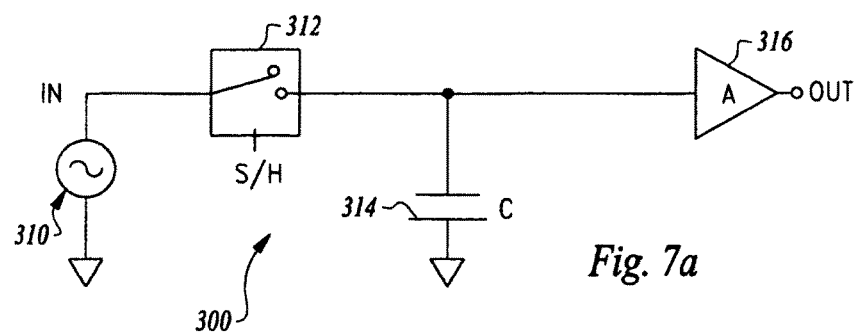
FIG. 7a shows a prior simple sample and hold circuit.
Figure 7B:
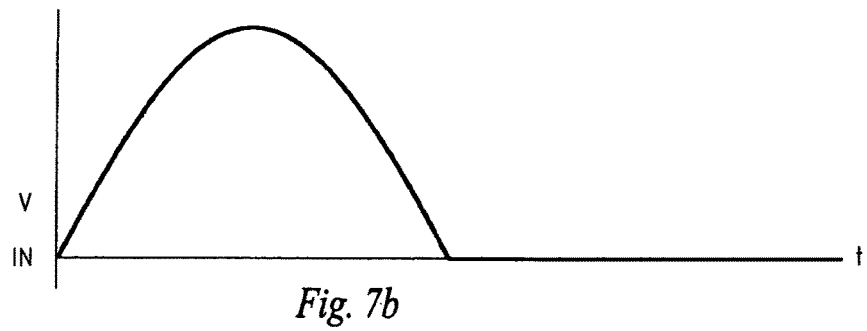
Figure 7C:
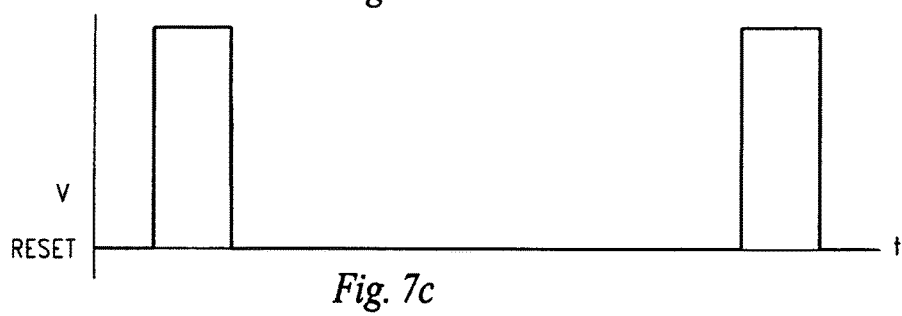
Figure 7D:
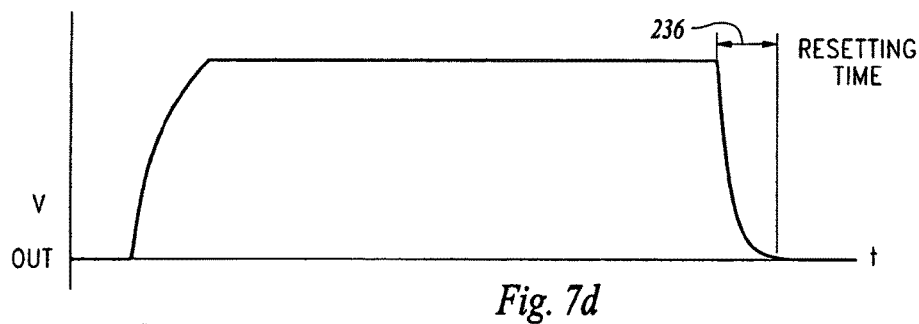
FIG. 7d shows the resulting output from the circuit in FIG. 7a when presented with the inputs from FIG. 7b.

FIG. 7a is another example of a prior circuit. In FIG. 7a, a sample and hold circuit is shown. FIG. 7b, shows a sample input, and FIG. 7c, shows the corresponding output. During the sample settling time 236, in FIG. 7d, if the hold signal is reasserted an erroneous output will result because the capacitor has not finished settling. In FIGS. 7b, 7c, and 7d, the x axis "t" represents time, and the y axis "v" represents voltage. To be discussed in more detail below, the improvement of the circuit in FIG. 7a, using the sub-circuit of the present invention is shown in FIGS. 8a, 8b, 8c, 8d, and 8e.

With reference again to FIG. 1a, a preferred embodiment of the invention is shown which improves the AC coupling circuit type shown in FIG. 3a using swapped capacitors. In operation, this improved circuit is very powerful for processing large dynamic range power measurements, where all signals are positive in polarity and a small fast varying signal of interest is superimposed on a slowly changing background signal. For example, since radar detecting diodes essentially sum the powers of all the signals across their frequency range, a slowly modulated signal in one band can invalidate a rapidly modulated signal in another. The circuit of the preferred embodiment, using swapped capacitors, allows the high speed modulated signal to be measured with good precision by canceling the slow signal every time the reset signal is applied. There are many ways to customize the preferred embodiment beyond that illustrated in FIG. 1a. For example, the logic and timing for the reset signal from memory 22, to discern rapidly modulated signals from the slow.

In a preferred embodiment, as applied to an AC coupling application circuit as exemplified in FIG. 1a, the sub-circuit is applied to the AC coupling application circuit wherein at least one of active capacitors 14, is an AC coupling capacitor 20. Preferably circuit 24, is operably linked to the sub-circuit to provide the desired DC voltage across any of said standby capacitors 16, and sets the standby capacitor voltage so that swapping the capacitors nulls the output of AC coupling filter 25, so that when a reset signal is applied as a trigger signal in said electronic switches 18, an output of the circuit is nulled.

In FIG. 1b the input signal is illustrated as presented to the circuit of FIG. 1a. The x axis "t" represents time, and the y axis "v" represents voltage.

In FIG. 1c the reset signal as presented to the circuit of FIG. 1a, is illustrated. The x axis "t" represents time, and the y axis "v" represents voltage.

In FIG. 1d, the resulting parity signal is shown for the input signal of FIG. 1b, for the circuit of FIG. 1a. The x axis "t" represents time, and the y axis "v" represents voltage.

Figure 1E:
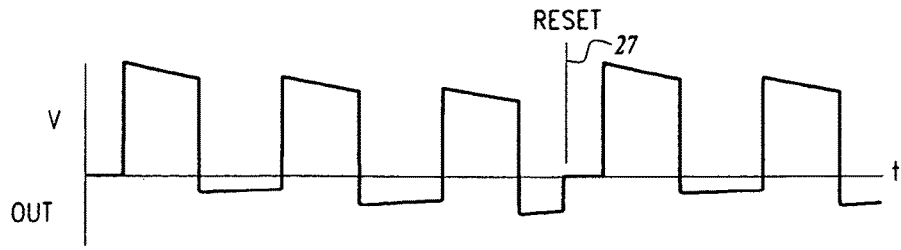
FIG. 1e shows the output of the circuit of FIG. 1a with the input from FIG. 1b, according to the invention.

With reference now to FIG. 1e, the output of the circuit of FIG. 1a is shown with the input signals from FIG. 1b and FIG. 1c. In FIG. 1e, the x axis "t" represents time, and the y axis "v" represents voltage. It is seen that the moment in time along the x axis when the reset signal is pulled high 27, and is marked for clarity. It is noted, that the defect seen in prior circuit seen in FIG. 3d, is not present.

As discussed, FIG. 4a shows a typical prior pseudo AC coupling circuit 250. FIG. 4b shows a sample input voltage signal for such circuit, with the x axis "t" represents time, and the y axis "v" represents voltage.

In FIG. 4c, the output of the circuit seen in FIG. 4a is shown with the input of FIG. 4b. It is seen that pseudo AC coupling circuit 250, output drifts to the average of the input. The x axis "t" represents time, and the y axis "v" represents voltage.

With reference now to FIG. 5a, a resettable version 270, of the circuit shown in FIG. 4a is shown. In FIG. 5a, input 272 is seen, with resistors 274 operably linked to amplifier 276, with capacitor 277, filter 278, and electronic switch 280.

Figure 5B:
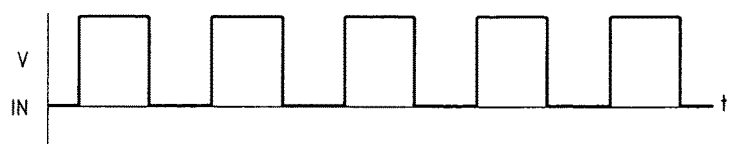

In FIG. 5b the input signal presented to the circuit in FIG. 5a is shown. The x axis "t" represents time, and the y axis "v" represents voltage.

Figure 5C:
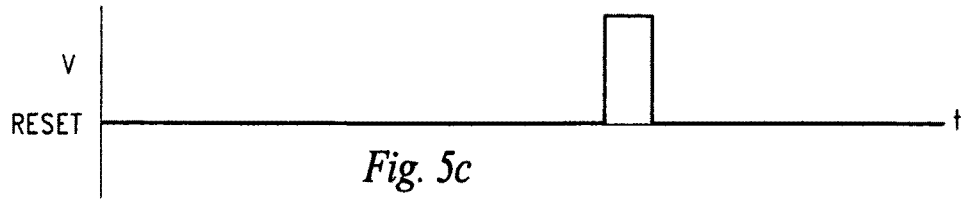

In FIG. 5c the reset signal present to the circuit in FIG. 5a is shown. The x axis "t" represents time, and the y axis "v" represents voltage.

Figure 5D:
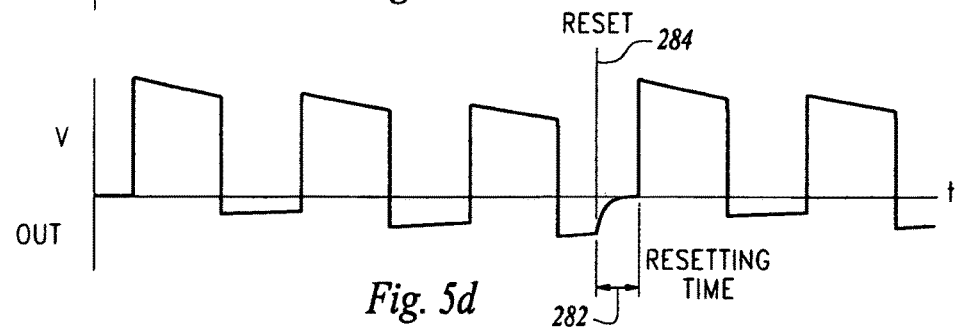
FIG. 5d shows the output signal of the circuit of FIG. 5a, from the input signal of FIG. 5b.

Referring now to FIG. 5d, the output signal of the circuit in FIG. 5a with the input of the signals from FIG. 5b and FIG. 5c. The x axis "t" represents time, and the y axis "v" represents voltage. The moment in time along the x axis when the reset signal is pulled high 284, is called out for clarity. The settling time 282, of the capacitor 277, is shown explicitly to clarify the time when the circuits output is erroneous.

Figure 6A:
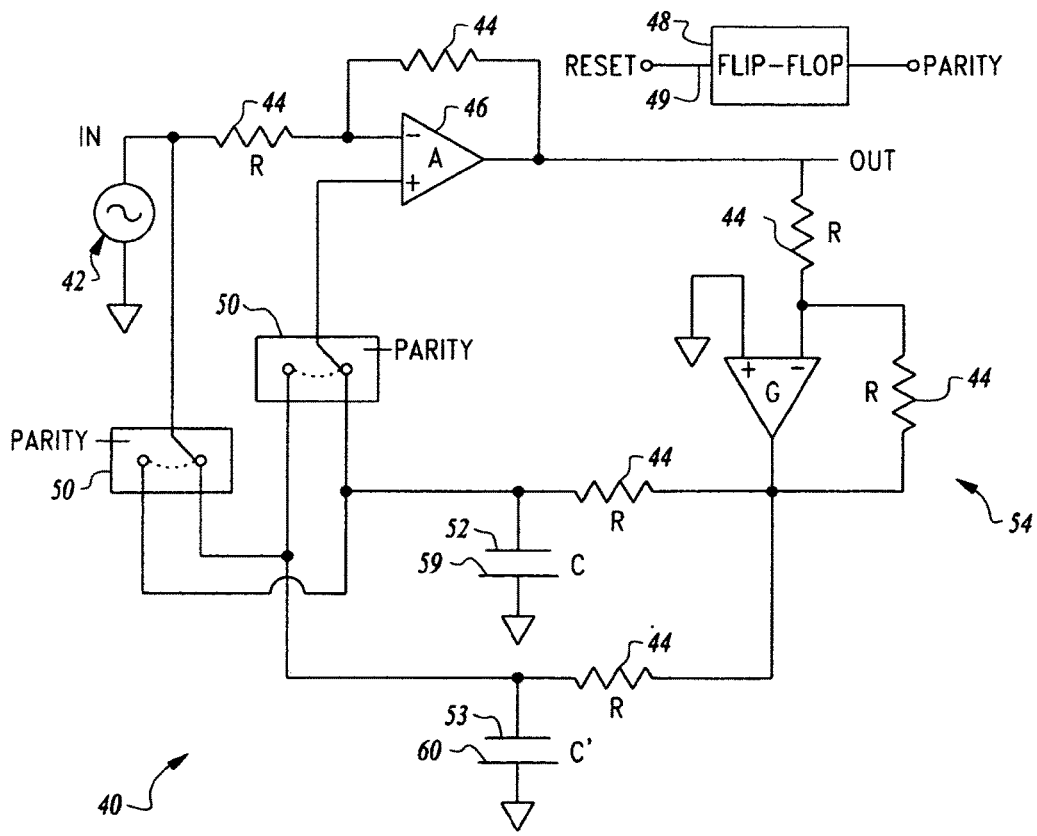
FIG. 6a shows another preferred embodiment of the invention applied to improve the circuit shown in FIG. 5a, according to the invention.

With reference now to FIG. 6a, another preferred embodiment of the invention is shown. FIG. 6a, shows a preferred embodiment of the invention as applied to improve the circuit shown in FIG. 5a. In FIG. 6a, circuit 40, has input signal 42, with resistors 44, and amplifier 46. Capacitor 52, with plates 59, is shown as active capacitor, and capacitor 53, with plates 60, is shown in standby mode. Of course, in various embodiments any number of capacitors may be used. Electronic switches 50, are shown operably linked to memory circuit 48, with the equivalent of one or more bits of memory, and to circuit 40. Accordingly, there are two signal paths only one of which is active at any given time, which is determined by the state of the flip flop. The moment the reset signal 49, is pulled high, the inactive capacitor 53, whose voltage is already held at a value designed to null the output, is swapped into circuit 40, as an active capacitor. This corrects the defect seen in FIG. 5a, as discussed above.

The circuit seen in FIG. 6a, is illustrative of a preferred embodiment of the invention as applied to a pseudo-AC coupling restoration circuit. In this preferred embodiment, at least one of active capacitors 52, is a pseudo-AC coupling capacitor. Preferably, circuit 42, is operably linked to sub-circuit 40, to provide said desired DC voltage across any of standby capacitors 53, and sets the standby capacitor voltage so that swapping the capacitors nulls the output of a pseudo-AC coupling filter 54, so that when a reset signal is applied as a trigger signal in electronic switches 50, the output of the circuit 40, is nulled.

Figure 6B:
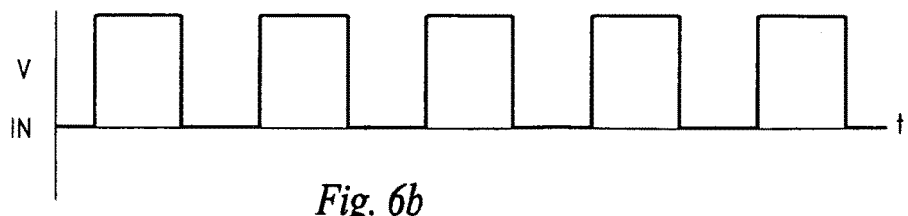
FIG. 6b shows the input signals presented to the circuit in 6a, according to the invention.

To further illustrate the operation of circuit 40, in FIG. 6a, it is seen in FIG. 6b, where the input signal presented to circuit 40, is plotted against time. In FIG. 6b, the x axis "t" represents time, and the y axis "v" represents voltage.

Figure 6C:
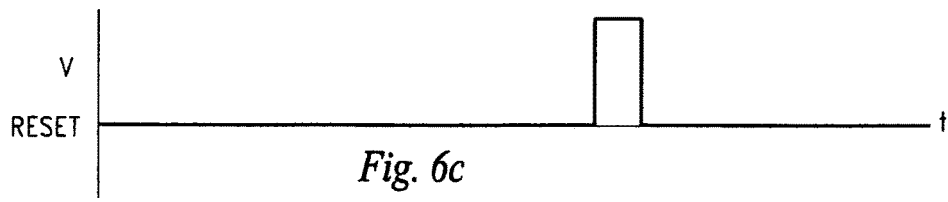
FIG. 6c shows the reset signals presented to the circuit of FIG. 6a, according to the invention.

In FIG. 6c the reset signal as presented to the circuit of FIG. 6a, is illustrated. The x axis "t" represents time, and the y axis "v" represents voltage.

Figure 6D:
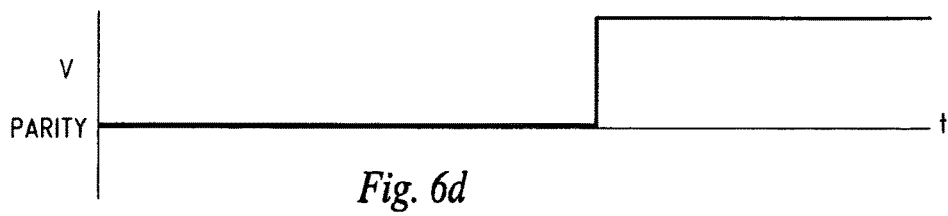
FIG. 6d shows the parity signal presented to the circuit of FIG. 6a, according to the invention.

In FIG. 6d, the resulting parity signal is shown for the input signal of FIG. 6b, for the circuit 40, of FIG. 6a. The x axis "t" represents time, and the y axis "v" represents voltage.

Figure 6E:
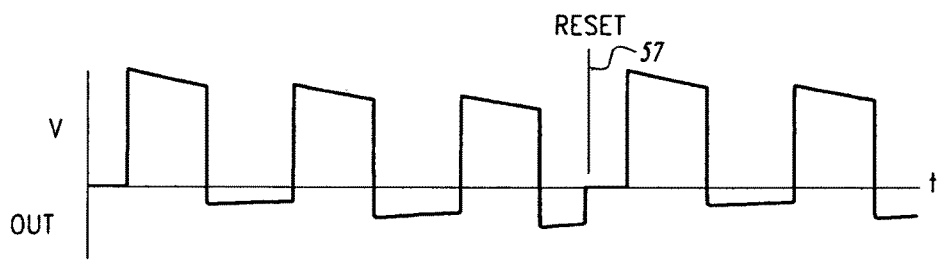
FIG. 6e shows the output of the circuit of FIG. 6a with the input from FIG. 6b, according to the invention.

With reference now to FIG. 6e, the output of the circuit of FIG. 6a is shown with the input signals from FIG. 6b and FIG. 6c. In FIG. 6e, the x axis "t" represents time, and the y axis "v" represents voltage. It is seen that the moment in time along the x axis when the reset signal is pulled high 57, and is marked for clarity. It is noted, that the defect seen in prior circuit seen in FIG. 5d, is not present.

In FIG. 7a, a prior sample and hold circuit 300, is shown with input signal 310, electronic switch 312, here a sample and hold (S/H) type switch, capacitor 314, here a hold type capacitor, and amplifier 316, to buffer the output. While the switch is closed the output will closely follow any inputs that do not exceed the RC time constant of the hold capacitor 314, and the on resistance of electronic switch 312. When the switch is open, the output will hold the value the input had at the moment the S/H signal was toggled.

Referring now to FIG. 7b, the input signal to the circuit of FIG. 7a is shown. The x axis "t" represents time, and the y axis "v" represents voltage.

In FIG. 7c, the reset signal present to the circuit of 7a is shown. The x axis "t" represents time, and the y axis "v" represents voltage.

In FIG. 7d, the resulting output from the circuit in FIG. 7a, when presented with the inputs from FIG. 7b and FIG. 7c. The settling time defect 236, is shown explicitly. The x axis "t" represents time, and the y axis "v" represents voltage.

Figure 8A:
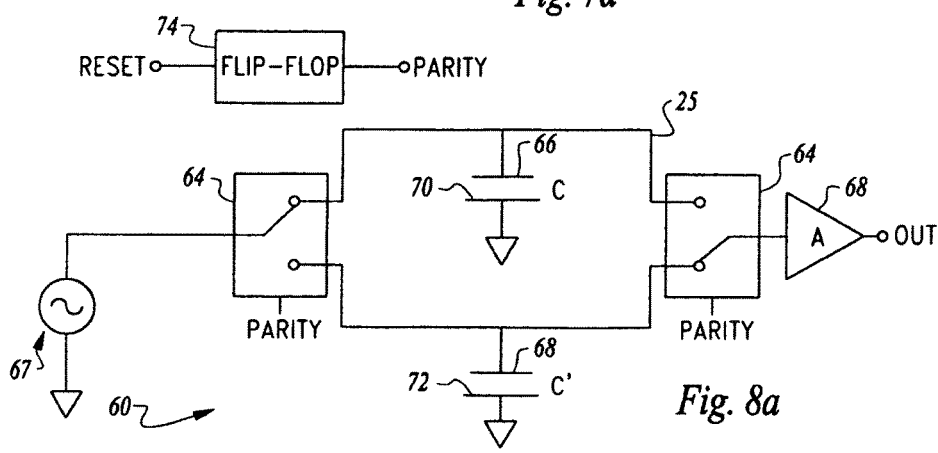
FIG. 8a shows another preferred embodiment of the invention applied to improve the circuit in FIG. 7a, according to the invention.

With reference now to FIG. 8a, another preferred embodiment of the invention is illustrated, where the circuit of FIG. 7a, is improved by the sub-circuit of the present invention resulting in the improved sample/track and hold type circuit 60, shown in FIG. 8a. Circuit 60, preferably has input 62, which may be circuitry to assert a demand DC voltage over any number of capacitors, switches 64, preferably electronic switches, and at least two capacitors shown as active capacitor 66 with plates 70, and standby capacitor 68 with plates 72. and amplifier 68 to buffer the output. Memory circuit 72, is shown operably linked to the circuit and has at least one or more bits of memory to determine which capacitor is active or standby. Preferably at least one of the capacitors is active in the application circuit, and at least one is held on standby. Switches 64, operably interchange one or both plates 66 or 72, of any standby or active capacitors when an electronic trigger signal is raised, effectively making what was previously an active capacitor a standby capacitor and what was previously a standby capacitor an active capacitor. Memory 74, determines which capacitor is currently active, and which is standby. In FIG. 8a, preferably active capacitor 66 stores the hold voltage, which is buffered to the output and the input circuitry 62, asserts the track input voltage on the standby capacitor 68, and the trigger signal electronic switches 64 circuitry, is the signal to acquire a new hold value.

Figure 8B:
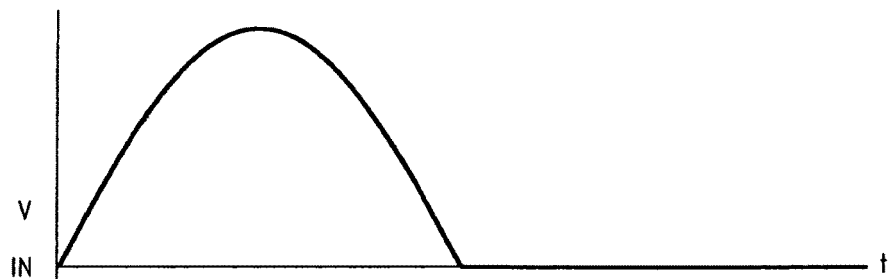
FIG. 8b shows a sample input signal presented to the circuit Of FIG. 8a, according to the invention.

In FIG. 8b, a sample input signal presented to circuit 60, of FIG. 8a is shown. The x axis "t" represents time, and the y axis "v" represents voltage.

Figure 8C:
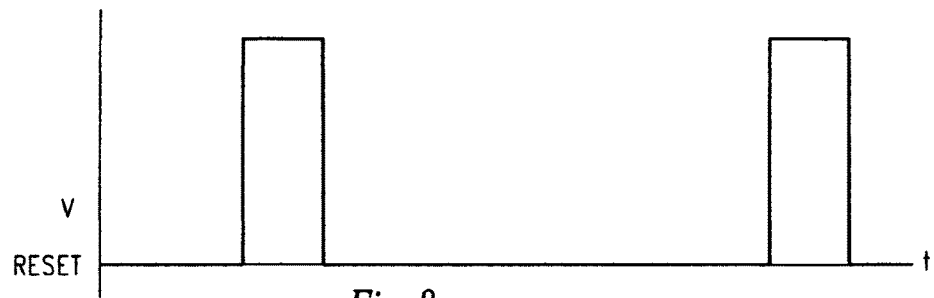
FIG. 8c shows a sample reset signal presented to the circuit Of FIG. 8a, according to the invention.

FIG. 8c, shows a reset signal presented to circuit 60, of FIG. 8a is shown. The x axis "t" represents time, and the y axis "v" represents voltage.

Figure 8D:
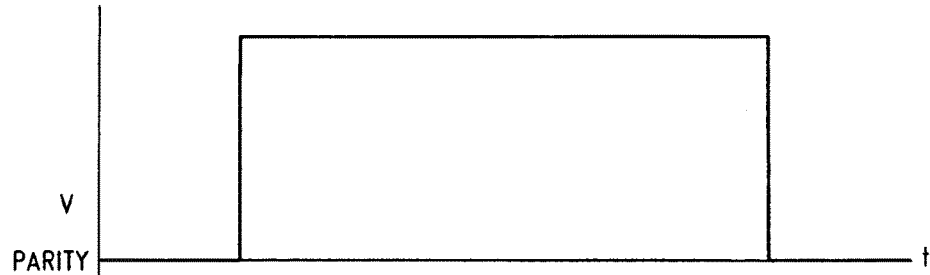
FIG. 8d shows a sample parity signal presented to the circuit of FIG. 8a, according to the invention.

With reference to FIG. 8d, the parity signal is shown of circuit 60, of FIG. 8a is shown. The x axis "t" represents time, and the y axis "v" represents voltage.

Figure 8E:
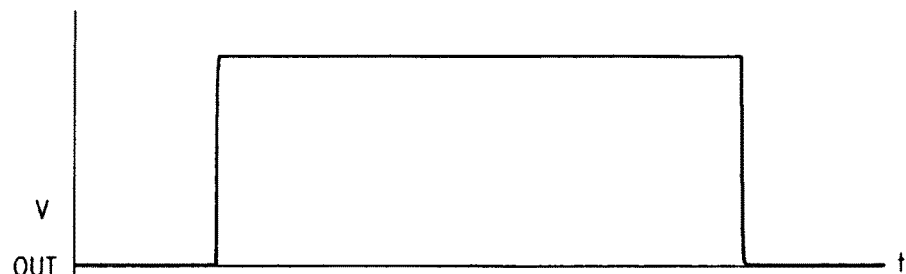
FIG. 8e shows a resulting output form the circuit in FIG. 8a with the inputs from FIGS. 8b, 8c, and 8d, according to the invention

In FIG. 8e, the resulting output from the signal inputs in FIG. 8b, FIG. 8c. and FIG. 8d. As can be seen, the settling defect is removed from that seen in FIG. 7d, due to the improvements provided by the present invention.

Figure 9:
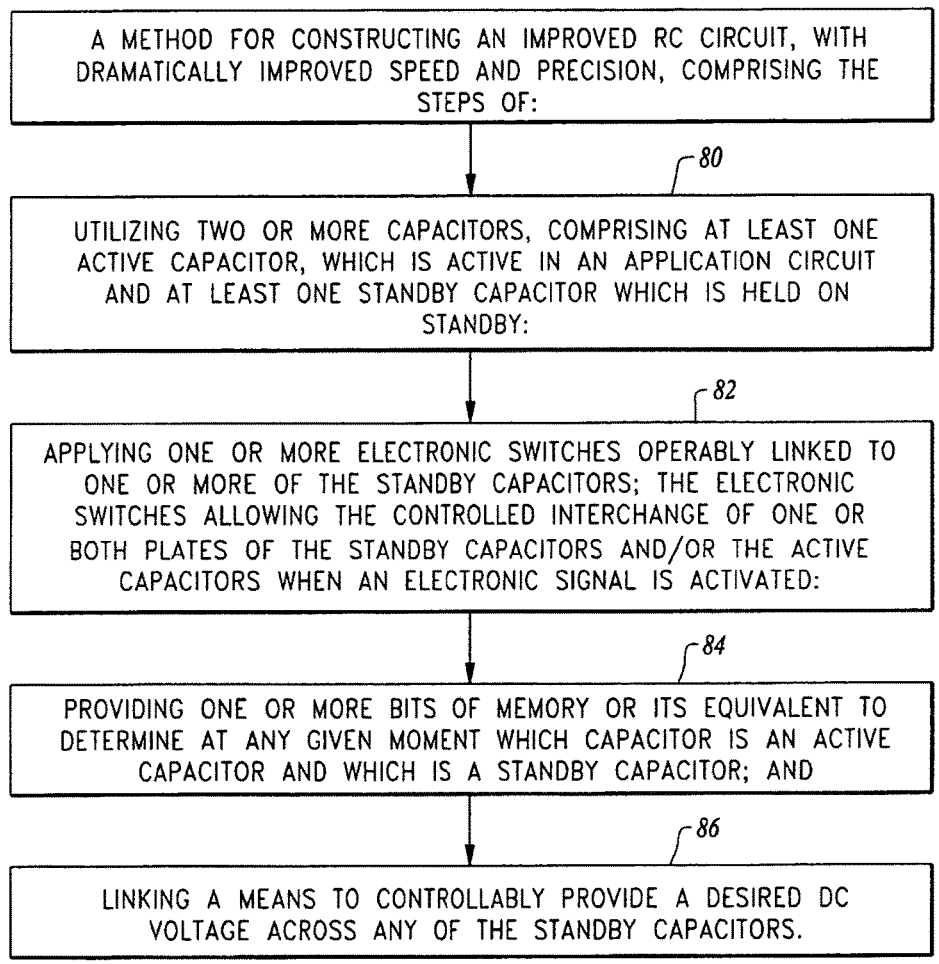
FIG. 9 shows a flow diagram for a method for constructing an improved RC circuit with dramatically improved speed and precision, according to the invention.

With reference now to FIG. 9, a method for constructing an improved RC circuit, with dramatically improved speed and precision is shown according to another preferred embodiment of the invention. This method comprises the steps of utilizing two or more capacitors, comprising at least one active capacitor, which is active in an application circuit and at least one standby capacitor which is held on standby 80. Next, applying one or more electronic switches operably linked to one or more of the standby capacitors. The electronic switches allowing the controlled interchange of one or both plates of the standby capacitors and/or the active capacitors when an electronic signal is activated 82. Next, providing one or more bits of memory or its equivalent to determine at any given moment which capacitor is an active capacitor and which is a standby capacitor 84. Then linking a means to controllably provide a desired DC voltage across any of the standby capacitors 86. The means to controllably provide a desired DC voltage across any of the standby capacitors may be a circuit or sub-circuit to assert the desired DC voltages across any of the standby capacitors.

In operation and use, the sub-circuit or circuit of the present invention using cyclically swapped capacitors provides both a circuit and a method to effectively force the voltage stored on a capacitor to an arbitrary voltage with great speed and precision, and is both highly effective and accurate when applied to a wide variety of circuit types and in many different applications.

Additional advantages and modification will readily occur to those skilled in the art. The invention in its broader aspects is, therefore, not limited to the specific details, representative apparatus and illustrative examples shown and described. Accordingly, departures from such details may be made without departing from the spirit or scope of the applicant's general inventive concept.

What is claimed is:

1. A sub-circuit, utilizing capacitor swapping, where swapping standby circuits is used to improve speed, accuracy, control, control, and precision of state change, comprising:

two or more capacitors, having at least one active capacitor, which is active in an application circuit and at least one standby capacitor which is held on standby;

one or more electronic switches operably linked to one or more of said standby capacitors; said electronic switches allowing the controlled interchange of one or both plates of said standby capacitors and/or said active capacitors when an electronic signal is activated, so as to effectively make what was previously an active capacitor a standby capacitor and what was previously a standby capacitor an active capacitor;

one or more bits of memory or its equivalent to determine at any given moment which capacitor is an active capacitor and which is a standby capacitor; and a circuit linked to said sub-circuit to provide a desired DC voltage across any of said standby capacitors.

2. The sub-circuit, utilizing capacitor swapping, where swapping standby circuits is used to improve speed accuracy, control, and precision of state change of claim 1, wherein said sub-circuit is applied to an AC coupling application circuit wherein at least one of said active capacitors is an AC coupling capacitor, said circuit operably linked to said sub-circuit to provide said desired DC voltage across any of said standby capacitors, this sets the standby capacitor voltage so that swapping the capacitors nulls the output of an AC coupling filter, so that when a reset signal is applied as a trigger signal in said electronic switches, an output of the circuit is nulled.

3. The sub-circuit, utilizing capacitor swapping, where swapping standby circuits is used to improve speed, accuracy, control, and precision of state change of claim 1, wherein said sub-circuit is applied to a pseudo-AC coupling restoration circuit so that at least one of said active capacitors is a pseudo-AC coupling capacitor, said circuit operably linked to said sub-circuit to provide said desired DC voltage across any of said standby capacitors, this sets the standby capacitor voltage so that swapping the capacitors nulls the output of a pseudo- AC coupling filter, so that when a reset signal is applied as a trigger signal in said electronic switches, an output of the circuit is nulled.

4. The sub-circuit, utilizing capacitor swapping, where swapping standby circuits is used to improve speed accuracy, control, and precision of state change of claim 1, wherein said sub-circuit is applied to a sample/track and hold application so that at least one of said active capacitors stores a hold voltage which is buffered to an output and to said circuit operably linked to said sub-circuit to allow a desired DC voltage across any of said standby capacitors, providing a track input voltage on at least one of said standby capacitors, and said one or more electronic switches operably linked to one or more of said standby capacitors provides a trigger signal to acquire a new hold voltage.

5. An improved AC coupling circuit, for processing large dynamic range power measurements, and to improve speed, accuracy, control, and precision of state change, the improvement comprising:
two or more capacitors, having at least one active capacitor, which is active and operable in an application circuit and at least one standby capacitor which is held on standby:
one or more electronic switches operably linked to one or more of said standby capacitors; said electronic switches provide for the controlled interchange of one or both plates of said standby capacitors and/or said active capacitors when an electronic signal is activated;
one or more bits of memory or its equivalent to determine at any given moment which capacitor is an active capacitor and which is a standby capacitor; and
instrumentalities providing a desired DC voltage across any of said standby capacitors linked to said AC coupling circuit.

6. The improved AC coupling circuit, for processing large dynamic range power measurements, and to improve speed, accuracy, control, and precision of state change of claim 5, wherein at least one of said active capacitors is an AC coupling capacitor, said means to provide said desired DC voltage across any of said standby capacitors being linked to said circuit and sets the standby capacitor voltage so that swapping the capacitors nulls the output of an AC coupling filter, so that when a reset signal is applied as a trigger signal in said electronic switches, an output of the circuit is nulled.

7. An improved pseudo-AC coupling circuit to improve speed, accuracy, control, and precision of state change, wherein the improvement comprising:
two or more capacitors, comprising at least one active capacitor, which is active and operable in an application circuit and at least one standby capacitor which is held on standby:
one or more electronic switches linked to one or more of said standby capacitors; said electronic switches allowing the controlled interchange of one or both plates of said standby capacitors and/or said active capacitors when an electronic signal is activated;
one or more bits of memory or its equivalent to determine at any given moment which capacitor is an active capacitor and which is a standby capacitor; and
instrumentalities providing a desired DC voltage across any of said standby capacitors.

8. The improved pseudo-AC coupling circuit to improve speed, accuracy, control, and precision of state change of claim 7, wherein at least one of said active and operable capacitors is a pseudo-AC coupling capacitor, said means to provide said desired DC voltage across any of said standby capacitors being linked to said pseudo-AC coupling circuit, and sets the standby capacitor voltage so that swapping the capacitors nulls the output of a pseudo-AC coupling filter, so that when a reset signal is applied as a trigger signal in said electronic switches, an output of the circuit is nulled.

9. An improved sample and hold application circuit, to improve speed, accuracy, and precision of state change, the improvement comprising:
two or more capacitors, comprising at least one active capacitor, which is active in an application circuit and at least one standby capacitor which is held on standby:
one or more electronic switches being linked to one or more of said standby capacitors; said electronic switches providing for the controlled interchange of one or both plates of said standby capacitors and/or said active capacitors when an electronic signal is activated;
one or more bits of memory or its equivalent to determine at any given moment which capacitor is an active capacitor and which is a standby capacitor; and
providing a desired DC voltage across any of said standby capacitors.

10. The improved sample and hold application circuit, to improve speed, accuracy, control, and precision of state change of claim 9, wherein at least one of said active capacitors stores a hold voltage which is buffered to an output and to said operably linked to said sub- circuit to provide a desired DC voltage across any of said standby capacitors, so as to provide a track input voltage on at least one of said standby capacitors, and said one or more electronic switches linked to one or more of said standby capacitors provides a trigger signal to acquire a new hold voltage.

11. A method for constructing an improved RC circuit, with dramatically improved speed, accuracy, and precision of state change, comprising the steps of:
using two or more capacitors, comprising at least one active capacitor, which is active in an application circuit and at least one standby capacitor which is held on standby:
applying one or more electronic switches linked to one or more of said standby capacitors; said electronic switches allow for the controlled interchange of one or both plates of said standby capacitors and/or said active capacitors when an electronic signal is activated;
providing one or more bits of memory or its equivalent to determine at any given moment which capacitor is an active capacitor and which is a standby capacitor; and
linking mechanism to controllably provide a desired DC voltage across any of the standby capacitors.

12. A sub-circuit utilizing parallel processing and capacitor swapping, to improve both speed, accuracy, control, and precision of state change, comprising,
two or more similar circuits that have some form of memory, whether it is a voltage across a capacitor, a current in an inductor, a digital value or otherwise, at least one of which is active in an application circuit and at least one of which is held on standby;
one or more electronic switches linked to one or more of said standby circuits; said electronic switches allowing for the controlled replacement of an active circuit with a standby circuit when an electronic signal is activated, so as to effectively make what was previously any number of active circuits standby circuits and what was any number of standby circuits active circuits; and
a circuit operably linked to said sub-circuit to provide a desired state to the memory of any of said standby circuits.

13. A method for changing the state of any sub-circuit that has memory or stored values, whether they are analog signals held on capacitors or inductors or digital values or otherwise, to improve speed, accuracy, control, and precision of state change, with extreme speed, accuracy, and precision, comprising the steps of:

using two or more copies of the sub-circuit, having at least one active copy, which is connected to the circuit via electronic switches and at least one standby copy which is held in a desired state;

applying one or more electronic switches linked to one or more of the standby copies; said electronic switches allowing the controlled replacement of the active copy or copies with a standby copy or copies when an electronic signal is activated; and providing a controllable mechanism to hold the standby copies in the desired state.

* * * * *